United States Patent
Lou et al.

(10) Patent No.: US 8,009,074 B2
(45) Date of Patent: Aug. 30, 2011

(54) DIGITAL-TO-ANALOG CONVERTER AND CODE MAPPING METHOD APPLIED TO THE DIGITAL-TO-ANALOG CONVERTER

(75) Inventors: Chih-Hong Lou, Yilan County (TW); Kuan-Hung Chen, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/686,354

(22) Filed: Jan. 12, 2010

(65) Prior Publication Data

US 2011/0169680 A1   Jul. 14, 2011

(51) Int. Cl.
*H03M 1/66* (2006.01)
(52) U.S. Cl. ........................ 341/150; 341/144
(58) Field of Classification Search ................ 341/144, 341/145, 154, 150
See application file for complete search history.

(56) References Cited

U.S. PATENT DOCUMENTS 4,947,169 A * 8/1990 Smith et al. ............... 341/121

* cited by examiner

*Primary Examiner* — Peguy JeanPierre
(74) *Attorney, Agent, or Firm* — Winston Hsu; Scott Margo

(57) ABSTRACT

A digital-to-analog converter includes an operational amplifying circuit, a switched capacitor circuit, an R-string sub-circuit, and a direct-charge transfer circuit. The operational amplifying circuit has a pair of differential input ends and a pair of differential output ends. The switched capacitor circuit is coupled to the pair of differential input ends of the operational amplifying circuit. The R-string sub-circuit is coupled to the switched capacitor circuit and the pair of differential input ends of the operational amplifying circuit. The direct-charge transfer circuit is coupled to the pair of differential input ends and the pair of differential output ends of the operational amplifying circuit.

10 Claims, 8 Drawing Sheets

| S (D[9]) | D[8:6] | B[8:6] | D_M[13:0] | Dout |
|---|---|---|---|---|
| 0 | 111 | 111 | 11111111111111 | +14 |
| 0 | 110 | 110 | 01111111111111 | +12 |
| 0 | 101 | 101 | 00111111111111 | +10 |
| 0 | 100 | 100 | 00011111111111 | +8 |
| 0 | 011 | 011 | 00001111111111 | +6 |
| 0 | 010 | 010 | 00000111111111 | +4 |
| 0 | 001 | 001 | 00000011111111 | +2 |
| 0 | 000 | 000 | 00000001111111 | 0 |
| 1 | 111 | 000 | 00000001111111 | 0 |
| 1 | 110 | 001 | 00000000111111 | -2 |
| 1 | 101 | 010 | 00000000011111 | -4 |
| 1 | 100 | 011 | 00000000001111 | -6 |
| 1 | 011 | 100 | 00000000000111 | -8 |
| 1 | 010 | 101 | 00000000000011 | -10 |
| 1 | 001 | 110 | 00000000000001 | -12 |
| 1 | 000 | 111 | 00000000000000 | -14 |

FIG. 6

| D[9] | D[8:5] | DM'[14:0] | Dout |
|---|---|---|---|
| 0 | 1111 | 111111111111111 | +15 |
| 0 | 1110 | 011111111111111 | +13 |
| 0 | 1101 | 001111111111111 | +11 |
| 0 | 1100 | 000111111111111 | +9 |
| 0 | 1011 | 000011111111111 | +7 |
| 0 | 1010 | 000001111111111 | +5 |
| 0 | 1001 | 000000111111111 | +3 |
| 0 | 1000 | 000000011111111 | +1 |
| 1 | 0111 | 000000001111111 | −1 |
| 1 | 0110 | 000000000111111 | −3 |
| 1 | 0101 | 000000000011111 | −5 |
| 1 | 0100 | 000000000001111 | −7 |
| 1 | 0011 | 000000000000111 | −9 |
| 1 | 0010 | 000000000000011 | −11 |
| 1 | 0001 | 000000000000001 | −13 |
| 1 | 0000 | 000000000000000 | −15 |

FIG. 7

DIGITAL-TO-ANALOG CONVERTER AND CODE MAPPING METHOD APPLIED TO THE DIGITAL-TO-ANALOG CONVERTER

BACKGROUND

The present disclosure is related to a digital-to-analog converter and a code mapping method applied to the digital-to-analog converter, and more particularly, to a digital-to-analog converter which integrates a switched capacitor circuit and a direct-charge transfer circuit into its architecture and related code mapping method.

A digital-to-analog converter (DAC) is a common circuit element in various electronic devices and can generate an analog output voltage for application to back-end circuits according to a digital input value. Traditionally, a high speed DAC circuit is implemented by a current steering DAC architecture. Although the current steering DAC architecture has an advantage of high speed, it also has disadvantages of occupying area and high power consumption. Thus, it is only suitable for applications of lower than 10 bits and higher than 100 MHz, and is not suitable for applications for low power consumption.

As regards applications for low power consumption, a switched capacitor (SC) DAC architecture or an SC DAC collocating with an R-string sub DAC architecture can give consideration to performance, area, and power consumption. However, the performance of this architecture is restricted to the slew-rate of the operational amplifier (OPA). A direct charge transfer SC DAC architecture can solve the abovementioned slew-rate problem, but it needs more capacitors than the SC DAC collocating with the R-string sub DAC architecture if they have the same number of quantized levels. Hence, in order to simultaneously possess all the abovementioned advantages without increasing the number of capacitors within the DAC architecture, the existing DAC architectures need to be improved.

SUMMARY OF THE DISCLOSURE

It is an objective of the claimed disclosure to provide a digital-to-analog converter and a code mapping method applied to the digital-to-analog converter.

According to an embodiment of the present disclosure, a digital-to-analog converter is provided. The digital-to-analog converter includes an operational amplifying circuit, a switched capacitor circuit, an R-string sub-circuit, and a direct-charge transfer circuit. The operational amplifying circuit has a pair of differential input ends and a pair of differential output ends. The switched capacitor circuit is coupled to the pair of differential input ends of the operational amplifying circuit. The R-string sub-circuit is coupled to the switched capacitor circuit and the pair of differential input ends of the operational amplifying circuit. The direct-charge transfer circuit is coupled to the pair of differential input ends and the pair of differential output ends of the operational amplifying circuit.

According to an embodiment of the present disclosure, a digital-to-analog converter for converting a digital input code into an analog output is provided. The digital input code has a first code segment, a second code segment, and a third code segment. The digital-to-analog converter includes an operational amplifying circuit, a switched capacitor circuit, an R-string sub-circuit, a direct-charge transfer circuit, and a code converting circuit. The operational amplifying circuit has a pair of differential input ends and a pair of differential output ends. The switched capacitor circuit is coupled to the pair of differential input ends of the operational amplifying circuit. The R-string sub-circuit is coupled to the switched capacitor circuit and the pair of differential input ends of the operational amplifying circuit. The direct-charge transfer circuit is coupled to the pair of differential input ends and the pair of differential output ends of the operational amplifying circuit. The code converting circuit is used for converting the first code segment with N bits into an updated first code segment with P bits according to a designated mapping manner, wherein N is less than P. The first code segment is utilized to control the direct-charge transfer circuit, the second code segment is utilized to control the switched capacitor circuit, and the third code segment is utilized to control the R-string sub-circuit.

According to an embodiment of the present disclosure, a code mapping method is provided. The code mapping method includes steps of: providing M bits of digital input codes; checking the $1^{st}$ bit of the M bits to generate a checking result; determining whether to perform 2's compliment operation on the remaining $2^{nd}$ to $M_{th}$ bits according to the checking result; and converting the preceding $1^{st}$ to $N^{th}$ bits of the M bits into P bits according to a designated mapping manner.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram showing a table of the code mapping algorithm shown in FIG. 5.

FIG. 7 is a diagram showing a table of a conventional code mapping algorithm.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
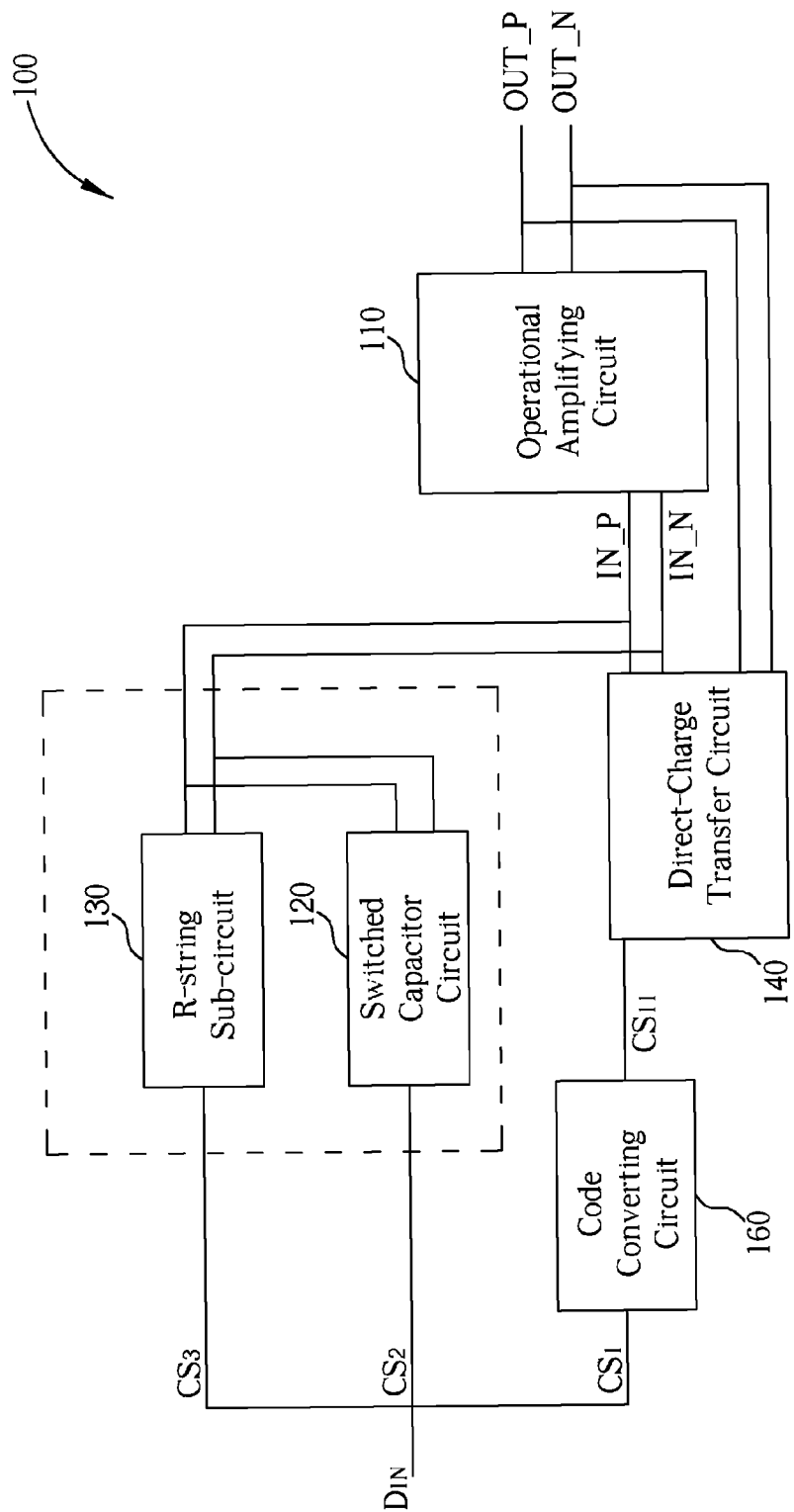
FIG. 1 is a block diagram of a digital-to-analog converter according to an embodiment of the present disclosure.

Please refer to FIG. 1. FIG. 1 is a block diagram of a digital-to-analog converter 100 according to an embodiment of the present disclosure. The digital-to-analog converter 100 includes, but is not limited to, an operational amplifying circuit 110, a switched capacitor circuit 120, an R-string sub-circuit 130, a direct-charge transfer circuit 140, and a code converting circuit 160. The digital-to-analog converter 100 converts a digital input code $D_{IN}$ into an analog output, wherein the digital input code $D_{IN}$ has a first code segment $CS_1$, a second code segment $CS_2$, and a third code segment $CS_3$. In one embodiment, the digital input code $D_{IN}$ has 10 bits represented by D[9:0], wherein D[9:6] represents the first code segment $CS_1$, D[5] represents the second code segment $CS_2$, and D[4:0] represents the third code segment $CS_3$. The first code segment $CS_1$ is utilized to control the direct-charge transfer circuit 140, the second code segment $CS_2$ is utilized to control the switched capacitor circuit 120, and the third code segment $CS_3$ is utilized to control the R-string sub-circuit 130.

Please keep referring to FIG. 1. The operational amplifying circuit 110 has a pair of differential input ends IN_P and IN_N and a pair of differential output ends OUT_P and OUT_N. The switched capacitor circuit 120 is coupled to the pair of differential input ends IN_P and IN_N of the operational amplifying circuit 110. The R-string sub-circuit 130 is coupled to the switched capacitor circuit 120 and the pair of differential input ends IN_P and IN_N of the operational amplifying circuit 110. The direct-charge transfer circuit 140 is coupled to the pair of differential input ends IN_P and IN_N and the pair of differential output ends OUT_P and OUT_N of the operational amplifying circuit 110. The code converting circuit 160 is used for converting the first code segment $CS_1$ with N bits into an updated first code segment $CS_{11}$ with P bits according to a designated mapping manner, wherein N is less than P. As an illustration, N equals 4 and P equals 14. Furthermore, please note that the numbers N and P are not fixed and can be adjusted depending on practical applications.

In the following, further descriptions for the architecture and operations of the operational amplifying circuit 110, the switched capacitor circuit 120, the R-string sub-circuit 130, the direct-charge transfer circuit 140, and the code converting circuit 160 are detailed as below.

Figure 2:
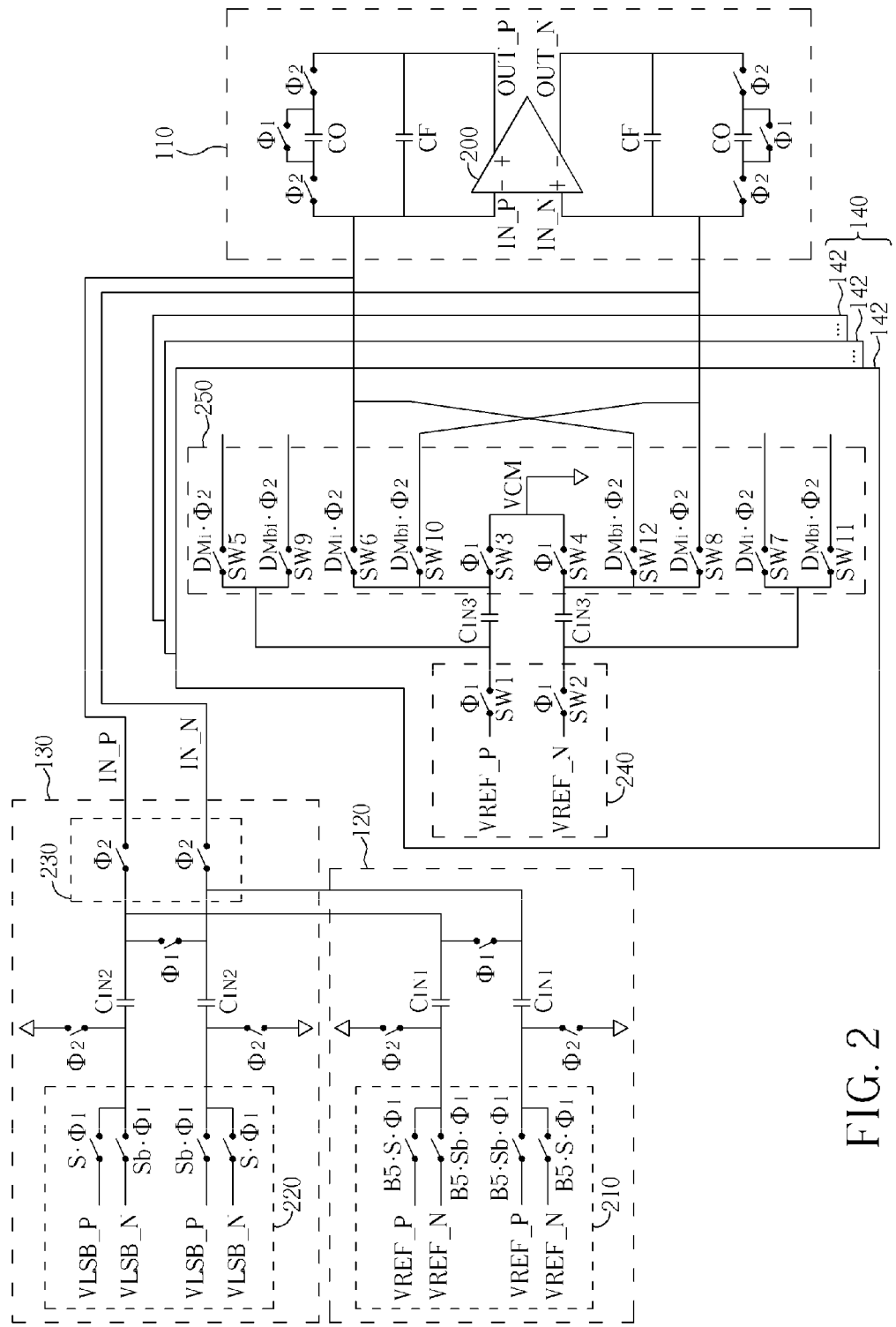
FIG. 2 is a diagram illustrating detailed circuit architecture of the digital-to-analog converter shown in FIG. 1.

Please refer to FIG. 2. FIG. 2 is a diagram illustrating detailed circuit architecture of the digital-to-analog converter 100 shown in FIG. 1. In this embodiment, the operational amplifying circuit 110 includes an operational amplifier 200 and a pair of filter capacitors CF. The operational amplifier 200 has the pair of differential input ends IN_P and IN_N and the pair of differential output ends OUT_P and OUT_N. Each of the filter capacitors CF is coupled between one of the differential input ends IN_P and IN_N and one of the differential output ends of the operational amplifier OUT_P and OUT_N. The switched capacitor circuit 120 includes a pair of first input capacitors $C_{IN1}$ and a first switching unit 210. The first switching unit 210 is coupled to the pair of first input capacitors $C_{IN1}$ and has a plurality of switches for controlling the pair of first input capacitors $C_{IN1}$ to connect to a first reference voltage VREF_P, to a second reference voltage VREF_N, or to each other. The R-string sub-circuit 130 includes a pair of second input capacitors $C_{IN2}$, a second switching unit 220, and a third switching unit 230. The second switching unit 220 is coupled to the pair of second input capacitors $C_{IN2}$. The second switching unit 220 has a plurality of switches for controlling the pair of second input capacitors $C_{IN2}$ to connect to a third reference voltage VLSB_P or a fourth reference voltage VLSB_N. The third switching unit 230 is coupled between the pair of first input capacitors $C_{IN1}$ and the pair of filter capacitors CF and between the pair of second input capacitors $C_{IN2}$ and the pair of filter capacitors CF for controlling whether to transfer charges from the pair of first input capacitors $C_{IN1}$ and the pair of second input capacitors $C_{IN2}$ to the pair of filter capacitors CF.

Figure 3:
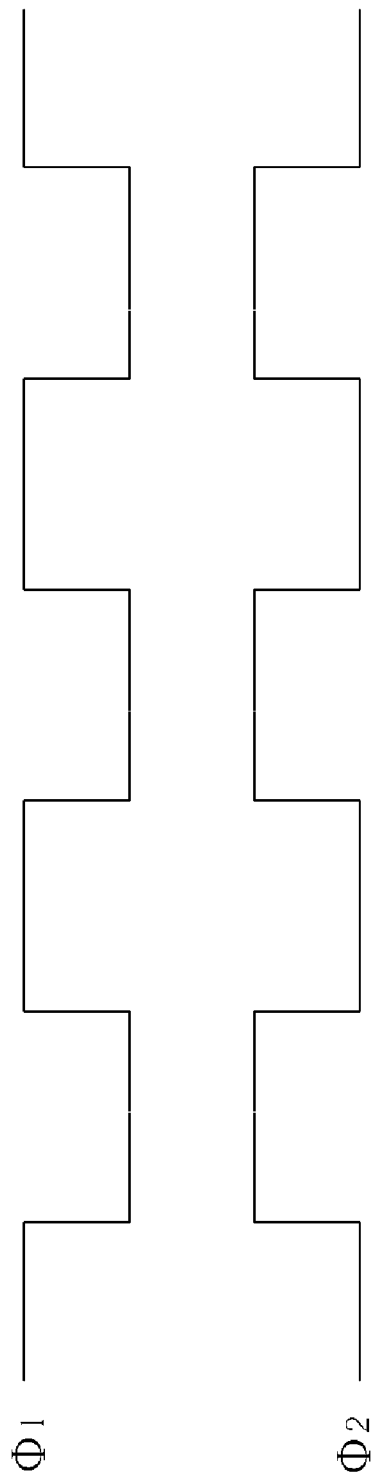
FIG. 3 is a diagram showing the waveforms of the first phase signal and the second phase signal shown in FIG. 2.

The direct-charge transfer circuit 140 includes a plurality of blocks 142. Each of the blocks 142 includes a pair of third input capacitors $C_{IN3}$, a fourth switching unit 240, and a fifth switching unit 250. The fourth switching unit 240 has a first switch SW1 and a second switch SW2. The fifth switching unit 250 has a plurality of switches SW3-SW12 coupled between the pair of third input capacitors $C_{IN3}$ and the pair of filter capacitors CF for controlling whether to transfer charges from the pair of third input capacitors $C_{IN3}$ to the pair of filter capacitors CF. The connection manner of the above-mentioned switches is already shown in FIG. 2, and further description is omitted here for brevity. What calls for special attention is that the first switching unit 210, the second switching unit 220, and the fourth switching unit 240 are controlled by at least a first phase signal $\phi_1$, and the third switching unit 230 and the fifth switching unit 250 are controlled by at least a second phase signal $\phi_2$ being an inverted signal of the first phase signal $\phi_1$. Their waveforms are shown in FIG. 3. During a period that the first phase signal $\phi_1$ is logic high, the corresponding switches are turned on to charge the input capacitors $C_{IN2}$, $C_{IN2}$, and $C_{IN3}$. During a period that the second phase signal $\phi_2$ is logic high, the corresponding switches are turned on to transfer charges from the input capacitors $C_{IN2}$, $C_{IN2}$, and $C_{IN3}$ to the filter capacitors CF in the next stage.

Figure 4:
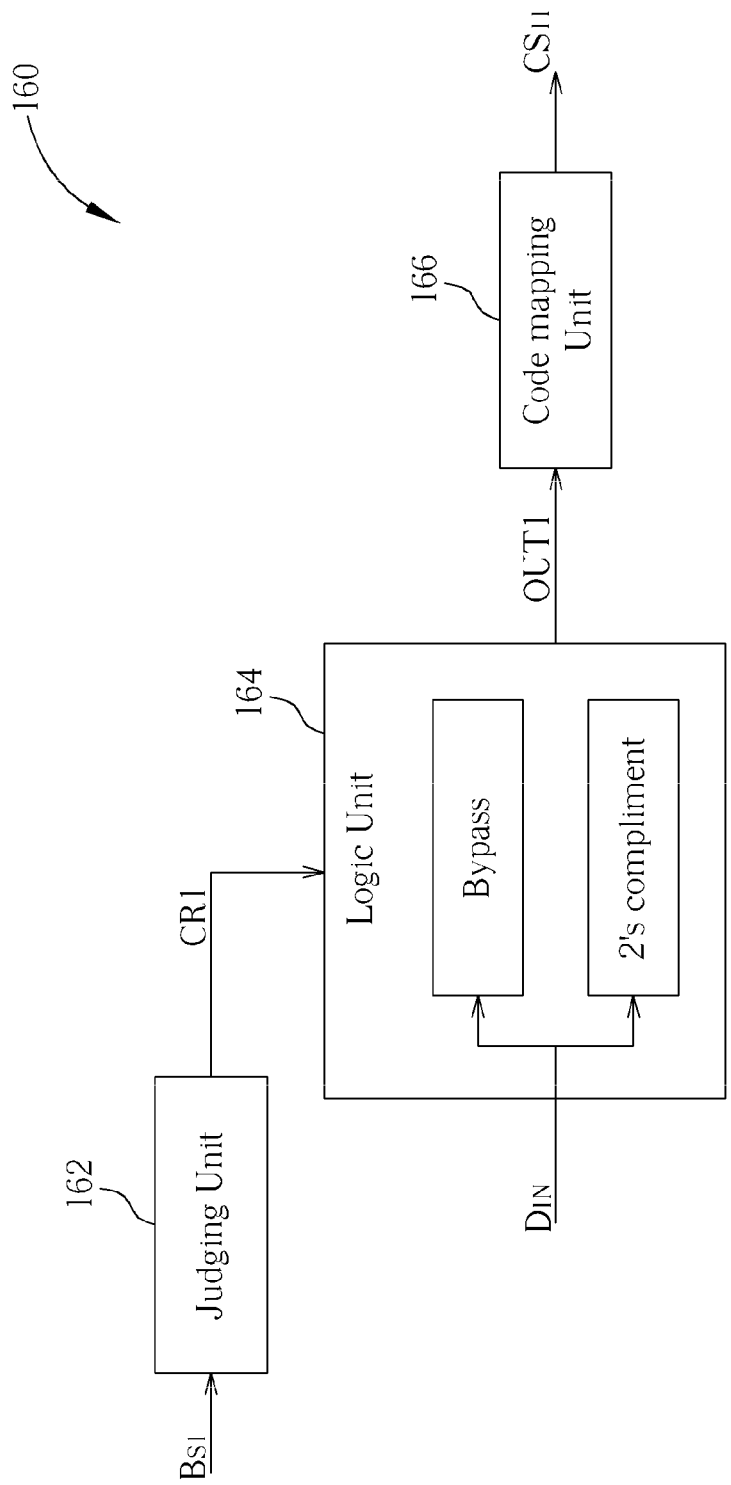
FIG. 4 is a diagram of an exemplary implementation of the code mapping circuit shown in FIG. 1.

Please refer to FIG. 4. FIG. 4 is a diagram of an exemplary implementation of the code mapping circuit 160 shown in FIG. 1. The code mapping circuit 160 includes a judging unit 162, a logic unit 164, and a code mapping unit 166. The judging unit 162 is used for checking a specific bit $B_{S1}$ of the digital input code $D_{IN}$ to generate a checking result CR1. The logic unit 164 is coupled to the judging unit 162 for referring to the checking result CR1 to directly pass the digital input code $D_{IN}$ or perform 2's compliment operation on all bits of the digital input code $D_{IN}$ except the specific bit $B_{S1}$, thereby generating an output OUT1. The code mapping unit 166 is coupled to the logic unit 164 for converting a specific code segment $CS_{1'}$ of the output OUT1 into the updated first code segment $CS_{11}$ according to a designated mapping manner, wherein the specific code segment $CS_{1'}$ is identical to the first code segment $CS_1$ when the logic unit 164 directly passes the digital input code $D_{IN}$, and the specific code segment $CS_{1'}$ is a 2's compliment of the first code segment $CS_1$ when the logic unit 164 performs the 2's compliment operation on all bits of the digital input code $D_{IN}$ except the specific bit $B_{S1}$. As an illustration, the digital input code $D_{IN}$ has 10 bits represented by D[9:0] and the output OUT1 also has 10 bits represented by B[9:0], wherein D[9] is the specific bit $B_{S1}$ of the digital input code $D_{IN}$, D[9:6] represents the first code segment $CS_1$, B[9:6] represents the specific code segment $CS_{1'}$, and $D_M$[13:0] represents the updated first code segment $CS_{11}$. When the specific bit $B_{S1}$ is logic low (i.e., D[9]=0), the digital input code $D_{IN}$ is directly passed. In other words, the output OUT1 is identical to the digital input code $D_{IN}$. For example, if D[8:0] is represented by "111111111", B[8:0] is represented by "111111111". On the other hand, when the specific bit $B_{S1}$ is logic high (i.e., D[9]=1), a 2's compliment operation is performed on all bits of the digital input code $D_{IN}$ except the specific bit $B_{S1}$ by the logic unit 164. For example, if D[8:0] is represented by "111111111", B[8:0] is represented by "000000000". The code mapping algorithm of the example mentioned above is shown in FIG. 5, wherein the Step 510 is performed by the judging unit 162 shown in FIG. 4, the steps 520 and 530 are performed by the logic unit 164, and the Step 540 is performed by the code mapping unit 166. In addition, how the code mapping unit 166 converts the specific code segment $CS_1$, of the output OUT1 into the updated first code segment $CS_{11}$ (i.e., B[9:0] to $D_M$[13:0] mapping) according to the designated mapping manner is further detailed in the following embodiments.

Figure 5:
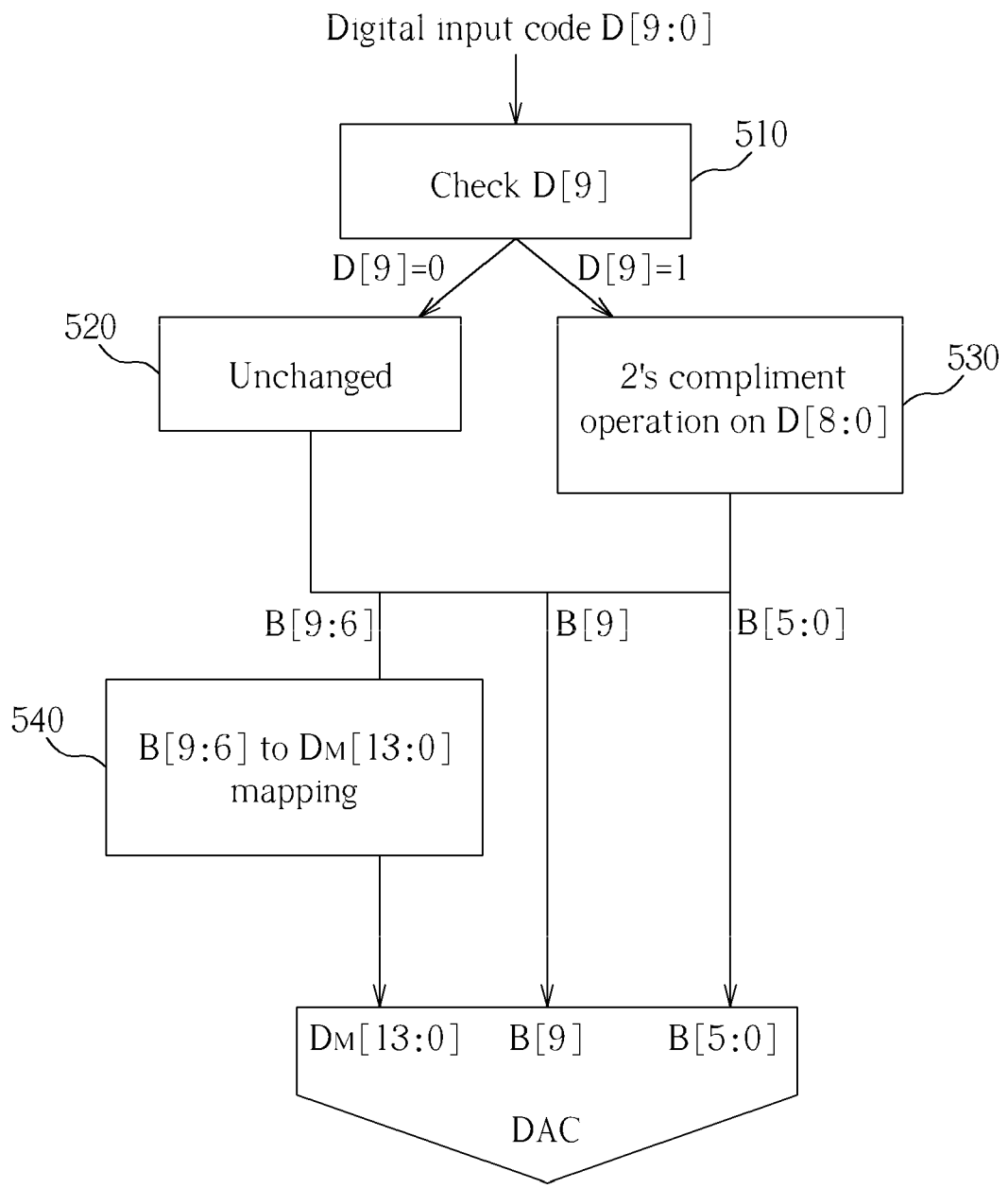
FIG. 5 is a simplified diagram showing a code mapping algorithm according to an embodiment of the present disclosure.

FIG. 6 is a diagram showing a table of the code mapping algorithm shown in FIG. 5. In this embodiment, the digital input code $D_{IN}$ has 10 bits represented by D[9:0] and the output OUT1 also has 10 bits represented by B[9:0], wherein D[9] is the specific bit $B_{S1}$ of the digital input code $D_{IN}$, D[9:6] represents the first code segment $CS_1$, B[9:6] represents the specific code segment $CS_1$', and $D_M$[13:0] represents the updated first code segment $CS_{11}$. First, the specific bit $B_{S1}$ (i.e., D[9]), being a sign bit, of the digital input code $D_{IN}$ is checked to generate the checking result CR1. If the checking result CR1 indicates that D[9] is logic low, D[8:0] is unchanged; if the checking result CR1 indicates that D[9] is logic high, a 2's compliment operation is performed on D[8:0] to generate B[8:0]. For example, if D[9]=0 and D[8:6]=111, B[8:6]=111 (unchanged). If D[9]=1 and D[8:6]=111, B[8:6]=000 (2's compliment). After that, the specific code segment $CS_1$' is converted into the updated first code segment $CS_{11}$ (i.e., B[9:0] to $D_M$[13:0] mapping) according to designated mapping manner. For D[9]=0, [8:6]=111 represents the maximum positive value and [8:6]=000 represents the minimum positive value. Therefore, the maximum positive value +14 is assigned to $D_M$[13:0]=11111111111111 and the minimum positive value +0 is assigned to $D_M$[13:0]= 00000001111111. For D[9]=1, [8:6]=111 represents the maximum negative value and [8:6]=000 represents the minimum negative value. The maximum negative value −14 is assigned to $D_M$[13:0]=00000000000000 and the minimum positive value −0 is assigned to $D_M$[13:0]=00000001111111. The rest can be deduced by analogy. It should be noted that the specific bit $B_{S1}$ (i.e., D[9]) is used not only as the sign bit but also for mapping.

Compared the designated code mapping algorithm disclosed in the present disclosure with the conventional code mapping algorithm shown in FIG. 7. In this table, D[9] is only used as the sign bit and D[8:5] are used for mapping. Due to D[8:5]=1111 representing the maximum value, D[8:5]=0000 representing the minimum value, and D[9] determining the sign, thus the maximum value +15 is assigned to $D_M$'[14:0]= 111111111111111 and the minimum value −15 is assigned to $D_M$'[14:0]=000000000000000. The difference between them is that the specific bit $B_{S1}$ (i.e., D[9]) is used not only as the sign bit but also for mapping in the designated mapping manner disclosed in the present disclosure, that is to say, whether a 2's compliment operation being performed or not is decided depending on the specific bit $B_{S1}$ (i.e., D[9]).

Please refer to FIG. 1 and FIG. 2 together with FIG. 6. As can be known, the first code segment $CS_1$ (i.e., D[9:6]) or the updated first code segment $CS_{11}$ (i.e., $D_M$[13:0]) is utilized to control the fifth switching units 250 in the blocks 142 of the direct-charge transfer circuit 140, the second code segment $CS_2$ (i.e., D[5]) is utilized to control the first switching unit 210 of the switched capacitor circuit 120, and the third code segment $CS_3$ (i.e., D[4:0]) is utilized to control the R-string sub-circuit 130.

Since the digital-to-analog converter 100 is implemented by merging the direct-charge transfer circuit 140 together with the switched capacitor circuit 120 and the R-string sub-circuit 130, the digital-to-analog converter 100 can reserve all the advantages provided by the SC-based DAC architecture and the direct charge transfer SC DAC architecture. It ensures that the fully differential circuit is perfect matched. In addition, because the stored charge is directly transferred from the input capacitors $C_{IN}$ to the filter capacitors CF in the direct charge transfer SC DAC architecture, the abovementioned slew-rate problem can be avoided and the distortion of the digital-to-analog converter 100 disclosed in the present disclosure can be improved. Furthermore, the SC DAC collocating with the R-string sub DAC architecture needs fewer capacitors to achieve the same number of quantized levels. For example, the digital-to-analog converter 100 is an i-bit DAC, wherein j bits are used in the direct-charge transfer circuit 140 and the remaining (i-j) bits are used in the switched capacitor circuit 120 and the R-string sub-circuit 130. Thus, the number of required capacitors is equal to $2^j$, wherein ($2^j$-2) capacitors operate in the direct-charge transfer circuit 140, one capacitor operates in the switched capacitor circuit 120, and the other one capacitor operates in the R-string sub-circuit 130. Please note that the ($2^j$-2) capacitors collocating with the code mapping algorithm shown in FIG. 5 and FIG. 6 can obtain the following quantized levels −($2^j$-2), −($2^j$-4), ..., ($2^j$-4), ($2^j$-2). In addition, the sign bit collocating with the residue (i-j) bits can obtain the residue quantized levels between them, i.e., −($2^j$-1), −($2^j$-3), ..., ($2^j$-3), ($2^j$-1). Therefore, the $2^j$ capacitors can generate $2^{(j+1)}$ quantized levels. If i=10 and j=4, there are 16 ($2^4$=16) capacitors in total so as to obtain 32 ($2^{(4+1)}$=32) quantized levels, wherein 14 capacitors are used in the direct-charge transfer circuit 140, 1 capacitor is used in the switched capacitor circuit 120, and 1 capacitor is used in the R-string sub-circuit 130.

In the abovementioned embodiments, the values of the numbers i and j are presented merely for describing the present disclosure, and in no way should be considered to be limitations of the scope of the present disclosure. Those skilled in the art should observe that various modifications of the values of the numbers i and j may be made without departing from the spirit of the present disclosure.

Take a 10-bit DAC as an example, the quantized level $D_{out}$ can be obtained through the equation listed below:

$$D_{out} = \left[\sum_{i=0}^{13} F(D_M[i])\right] \times 32 +$$
$$\text{Sign}(B_5 \times 32 + B_4 \times 16 + B_3 \times 8 + B_2 \times 4 + B_1 \times B_0 \times 1)$$

The designated code mapping algorithm is shown in FIG. 5 and FIG. 6. The sign bit (i.e., D[9]) is checked first. If D[9]=0, unchanged D[8:0] is used to generate B[8:0]. If D[9]=1, perform a 2's compliment operation on D[8:0] to generate B[8:0]. After that, B[9:6] is converted into $D_M$[13:0] through a 4-to-14 conversion mapping table shown in FIG. 6. $D_M$[13:0] is used for controlling the 14 capacitors in the direct-charge transfer circuit 140 to generate the even quantized levels, such as +14, +12, ..., −12, −14. The B[5:0] in conjunction with the sign bit D[9] can obtain the residue odd quantized levels, such as +15, +13, ..., −13, −15.

Figure 8:
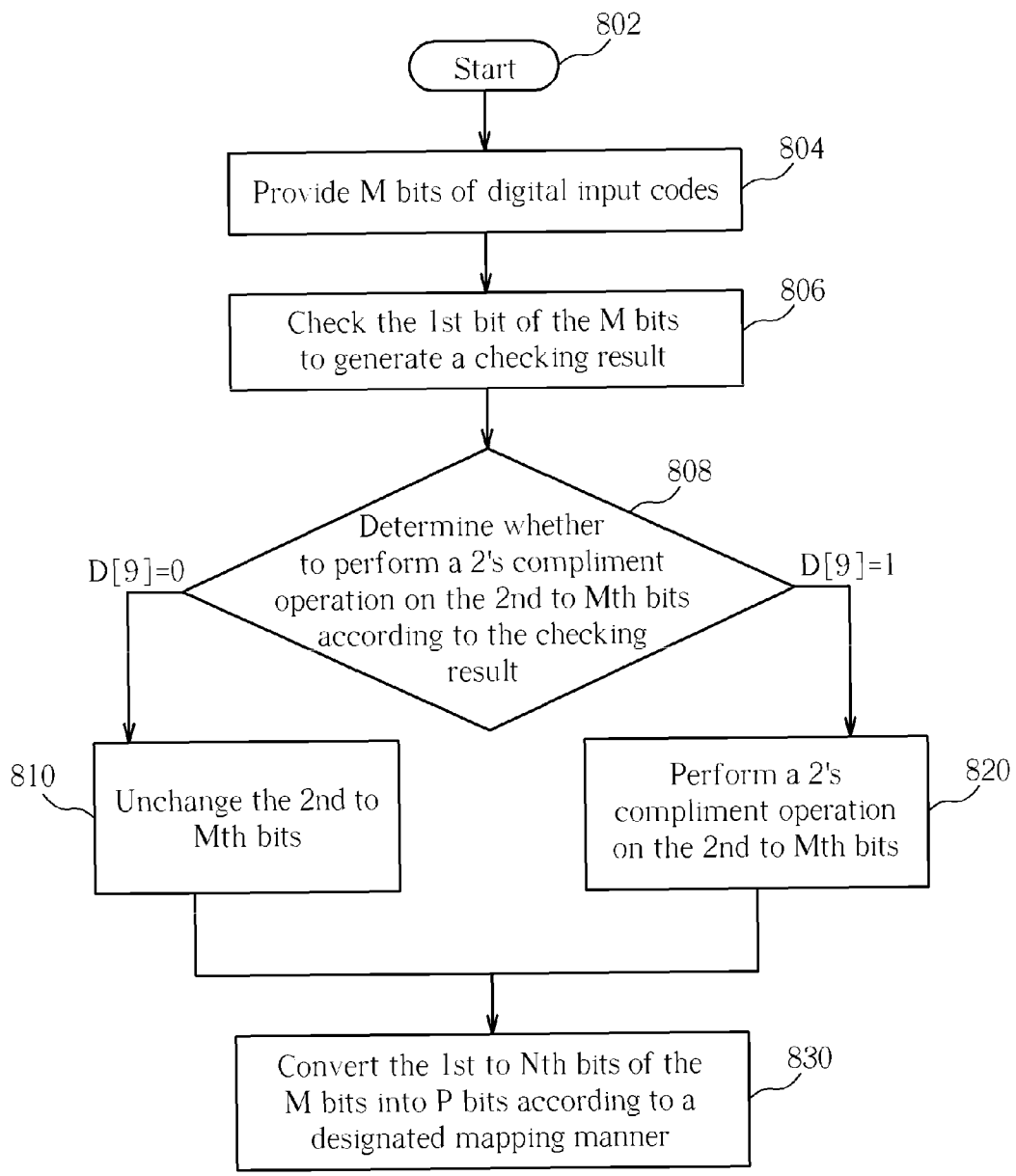
FIG. 8 is a flowchart illustrating a code mapping method according to an exemplary embodiment of the present disclosure.

Please refer to FIG. 8. FIG. 8 is a flowchart illustrating a code mapping method according to an exemplary embodiment of the present disclosure. Please note that the following steps are not limited to be performed according to the exact sequence shown in FIG. 8 if a roughly identical result can be obtained. The method includes, but is not limited to, the following steps:

Step 802: Start.

Step 804: Provide M bits of digital input codes.

Step 806: Check the $1^{st}$ bit of the M bits to generate a checking result.

Step 808: Determine whether to perform a 2's compliment operation on the $2^{nd}$ to $M_{th}$ bits according to the checking result. When the checking result indicates that the $1^{st}$ bit of the M bits is low, go to Step 810; otherwise, go to Step 820.

Step 810: Unchange the remaining $2^{nd}$ to $M^{th}$ bits. Go to Step 830.

Step 820: Perform a 2's compliment operation on the $2^{nd}$ to $M^{th}$ bits.

After that, go to Step 830.

Step 830: Convert the $1^{st}$ to $N^{th}$ bits of the M bits into P bits according to a designated code mapping manner.

In the following description, how each element operates is described by the steps shown in FIG. 8 in conjunction with the code mapping algorithm shown in FIG. 5 and FIG. 6 and the elements shown in FIG. 4. In Step 804, the digital input codes $D_{IN}$ with 10 bits D[9:0] (M=10) is provided. In Step 806, the $1^{st}$ bit (i.e., D[9]) of the digital input codes $D_{IN}$ is checked by the judging unit 162 to generate a checking result CR1. When the checking result CR1 indicates that D[9]=0, unchanged D[8:0] is used for generating B[8:0] (Step 810). When the checking result CR1 indicates that D[9]=1, perform a 2's compliment operation on D[8:0] to generate B[8:0] (Step 820). In Step 830, the $1^{st}$ to $N^{th}$ bits of the M bits is converted into P bits by the code mapping unit 166 according to a designated code mapping manner (i.e., B[9:6] to $D_M[13:0]$ mapping), wherein N=4 and P=14.

Please note that the abovementioned steps in the flowchart are merely an embodiment of the present disclosure, and in no way should be considered to be limitations of the scope of the present disclosure. The steps of the method shown in FIG. 8 need not be in the exact order shown and need not be contiguous: other steps can be intermediate without departing from the spirit of the present disclosure.

The abovementioned embodiments are presented merely for describing the present disclosure, and in no way should be considered to be limitations of the scope of the present disclosure. In summary, the present disclosure provides a digital-to-analog converter with a hybrid architecture. Through merging the direct charge transfer SC DAC architecture and the SC DAC collocating with the R-string sub DAC architecture so as to implement the digital-to-analog converter 100, all the advantages provided by the direct charge transfer SC DAC architecture and the SC DAC collocating with the R-string sub DAC architecture can be reserved. Due to the stored charge being directly transferred from the input capacitors $C_{IN3}$ to the filter capacitors CF in the direct-charge transfer circuit 140, the abovementioned slew-rate problem can be avoided and the distortion of the digital-to-analog converter 100 disclosed in the present disclosure can be improved. In addition, the ($2^j$-2) capacitors collocating with the code mapping algorithm shown in FIG. 5 and FIG. 6 can obtain the even quantized levels $-(2^j-2), -(2^j-4), \ldots, (2^j-4), (2^j-2)$. The sign bit collocating with the residue (i-j) bits can obtain the residue odd quantized levels between them, i.e., $-(2^j-1)$, $-(2^j-3), \ldots, (2^j-3), (2^j-1)$. Therefore, the $2^j$ capacitors are able to generate $2^{(j+1)}$ quantized levels. The digital-to-analog converter 100 needs fewer capacitors to achieve the same number of quantized levels as the SC DAC collocating with the R-string sub DAC architecture.

Those skilled in the art will readily observe that numerous modifications and alterations of the device and method may be made while retaining the teachings of the disclosure.

What is claimed is:

1. A digital-to-analog converter, comprising:
    an operational amplifying circuit, having a pair of differential input ends and a pair of differential output ends;
    a switched capacitor circuit, coupled to the pair of differential input ends of the operational amplifying circuit;
    an R-string sub-circuit, coupled to the switched capacitor circuit and the pair of differential input ends of the operational amplifying circuit; and
    a direct-charge transfer circuit, coupled to the pair of differential input ends and the pair of differential output ends of the operational amplifying circuit.

2. The digital-to-analog converter of claim 1, wherein the operational amplifying circuit further comprises:
    an operational amplifier, having the pair of differential input ends and the pair of differential output ends; and
    a pair of filter capacitors, each of the filter capacitors coupled between one of the differential input ends and one of the differential output ends of the operational amplifier.

3. The digital-to-analog converter of claim 2, wherein the switched capacitor circuit comprises:
    a pair of first input capacitors; and
    a first switching unit, coupled to the pair of first input capacitors, the first switching unit having a plurality of switches for controlling the pair of first input capacitors to connect to a first reference voltage, to a second reference voltage, or to each other.

4. The digital-to-analog converter of claim 3, wherein the R-string sub-circuit comprises:
    a pair of second input capacitors;
    a second switching unit, coupled to the pair of second input capacitors, the second switching unit having a plurality of switches for controlling the pair of second input capacitors to connect to a third reference voltage or a fourth reference voltage; and
    a third switching unit, coupled between the pair of first input capacitors and the pair of filter capacitors and between the pair of second input capacitors and the pair of filter capacitors, for controlling whether to transfer charges from the pair of first input capacitors and the pair of second input capacitors to the pair of filter capacitors.

5. The digital-to-analog converter of claim 4, wherein the direct-charge transfer circuit comprises a plurality of blocks, each of the blocks comprising:
    a pair of third input capacitors;
    a fourth switching unit, having a switch coupled between the first reference voltage and one of the third input capacitors and another switch coupled between the second reference voltage and the other one of the third input capacitors; and
    a fifth switching unit, having a plurality of switches coupled between the pair of third input capacitors and the pair of filter capacitors, for controlling whether to transfer charges from the pair of third input capacitors to the pair of filter capacitors.

6. The digital-to-analog converter of claim 5, wherein the first switching unit, the second switching unit, and the fourth switching unit are controlled by at least a first phase signal, and the third switching unit and the fifth switching unit are controlled by at least a second phase signal being an inverted signal of the first phase signal.

7. The digital-to-analog converter of claim 6, wherein the digital-to-analog converter converts a digital input code into an analog output, the digital input code has a first code segment, a second code segment, and a third code segment, the first code segment is utilized to control fifth switching units in the blocks of the direct-charge transfer circuit, the second code segment is utilized to control the first switching unit of the switched capacitor circuit, and the third code segment is utilized to control the R-string sub-circuit.

8. The digital-to-analog converter of claim 7, further comprising a code converting circuit for converting the first code segment with N bits into an updated first code segment with P bits according to a designated mapping manner; wherein N is smaller than P, and the fifth switching units in the blocks of the direct-charge transfer circuit are controlled by the updated first code segment.

9. A digital-to-analog converter for converting a digital input code into an analog output, the digital input code having a first code segment, a second code segment, and a third code segment, the digital-to-analog converter comprising:
   an operational amplifying circuit, having a pair of differential input ends and a pair of differential output ends;
   a switched capacitor circuit, coupled to the pair of differential input ends of the operational amplifying circuit;
   an R-string sub-circuit, coupled to the switched capacitor circuit and the pair of differential input ends of the operational amplifying circuit;
   a direct-charge transfer circuit, coupled to the pair of differential input ends and the pair of differential output ends of the operational amplifying circuit; and
   a code converting circuit, for converting the first code segment with N bits into an updated first code segment with P bits according to a designated mapping manner;
   wherein N is smaller than P, the first code segment is utilized to control the direct-charge transfer circuit, the second code segment is utilized to control the switched capacitor circuit, and the third code segment is utilized to control the R-string sub-circuit.

10. The digital-to-analog converter of claim 9, wherein the code converting circuit comprises:
   a judging unit, for checking a specific bit of the digital input code to generate a checking result;
   a logic unit, coupled to the judging unit, for referring to the checking result to pass the digital input code or perform 2's compliment operation on all bits of the digital input code except the specific bit, thereby generating an output; and
   a code mapping unit, coupled to the logic unit, for converting a specific code segment of the output into the updated first code segment, wherein the specific code segment is identical to the first code segment when the logic unit bypasses the digital input code, and the specific code segment is a 2's compliment of the first code segment when the logic unit perform the 2's compliment operation on all bits of the digital input code except the specific bit.

* * * * *